United States Patent [19]
Lee et al.

[11] Patent Number: 5,631,576
[45] Date of Patent: May 20, 1997

[54] PROGRAMMABLE LOGIC ARRAY INTEGRATED CIRCUIT DEVICES WITH FLEXIBLE CARRY CHAINS

[75] Inventors: Fung F. Lee, Milpitas; John Tse, El Cerrito, both of Calif.

[73] Assignee: Altera Corporation, San Jose, Calif.

[21] Appl. No.: 522,554

[22] Filed: Sep. 1, 1995

[51] Int. Cl.$^6$ .................................................. H03K 19/177
[52] U.S. Cl. .................................................. 326/39; 326/41
[58] Field of Search .................................. 326/37, 39–41, 326/46–47, 53

[56] References Cited

U.S. PATENT DOCUMENTS

| | | |
|---|---|---|
| Re. 34,363 | 8/1993 | Freeman . |
| 3,473,160 | 10/1969 | Wahlstrom ........................ 340/172.5 |
| 4,609,986 | 9/1986 | Hartmann et al. ................. 364/200 |
| 4,617,479 | 10/1986 | Hartmann et al. . |
| 4,642,487 | 2/1987 | Carter . |
| 4,677,318 | 6/1987 | Veenstra . |
| 4,713,792 | 12/1987 | Hartmann et al. ................. 364/900 |
| 4,758,745 | 7/1988 | Elgamal et al. . |
| 4,774,421 | 9/1988 | Hartmann et al. . |
| 4,871,930 | 10/1989 | Wong et al. . |
| 4,899,067 | 2/1990 | So et al. . |
| 4,912,342 | 3/1990 | Wong et al. . |
| 4,963,770 | 10/1990 | Keida ............................... 326/40 |
| 5,121,006 | 6/1992 | Pedersen . |
| 5,220,214 | 6/1993 | Pedersen . |
| 5,258,668 | 11/1993 | Cliff et al. . |
| 5,260,610 | 11/1993 | Pedersen et al. . |
| 5,260,611 | 11/1993 | Cliff et al. . |
| 5,274,581 | 12/1993 | Cliff et al. ........................ 364/784 |
| 5,349,250 | 9/1994 | New .................................. 326/53 |
| 5,350,954 | 9/1994 | Patel . |
| 5,371,422 | 12/1994 | Patel et al. ........................ 326/41 |
| 5,448,185 | 9/1995 | Kaptaroglu ........................ 326/39 |

OTHER PUBLICATIONS

R. C. Minnick, "A Survey of Microcellular Research," Journal of the Association for Computing Machinery, vol. 14, No. 2, pp. 203–241, Apr. 1967.

S. E. Wahlstrom, "Programmable Logic Arrays—Cheaper by the Millions," Electronics, Dec. 11, 1967, pp. 90–95.

*Recent Developments in Switching Theory*, A. Mukhopadhyay, ed., Academic Press, New York, 1971, chapters VI and IX, pp. 229–254 and 369–422.

El Gamal et al., "An Architecture for Electrically Configurable Gate Arrays," IEEE Journal of Solid–State Circuits, vol. 24, No. 2, Apr. 1989, pp. 394–398.

El-Ayat et al., "A CMOS Electrically Configurable Gate Array," IEEE Journal of Solid–State Circuits, vol. 24, No. 3, Jun. 1989, pp. 752–762.

"XC5000 Logic Cell Array Family, Technical Data, Advance Information," Xilinx, Inc., Feb. 1995.

*Primary Examiner*—Edward P. Westin
*Assistant Examiner*—Jon Santamauro
*Attorney, Agent, or Firm*—Fish & Neave; Robert R. Jackson

[57] ABSTRACT

A programmable logic array integrated circuit has a plurality of logic modules, each of which is programmable to perform any of several logic functions. One such function is the performance of one place of binary addition yielding a sum out signal and a carry out signal. In addition to a dedicated carry chain which conveys the carry out signal of each logic module to the carry in input of another predetermined logic module, circuitry is provided for allowing the carry out signal of each logic module to be alternatively routed through the more general interconnection circuitry of the device. This increases the flexibility of routing of the carry out signals, thereby increasing the flexibility of use of the integrated circuit. Improved circuitry for handling a carry in signal may also be provided in each logic module.

5 Claims, 2 Drawing Sheets

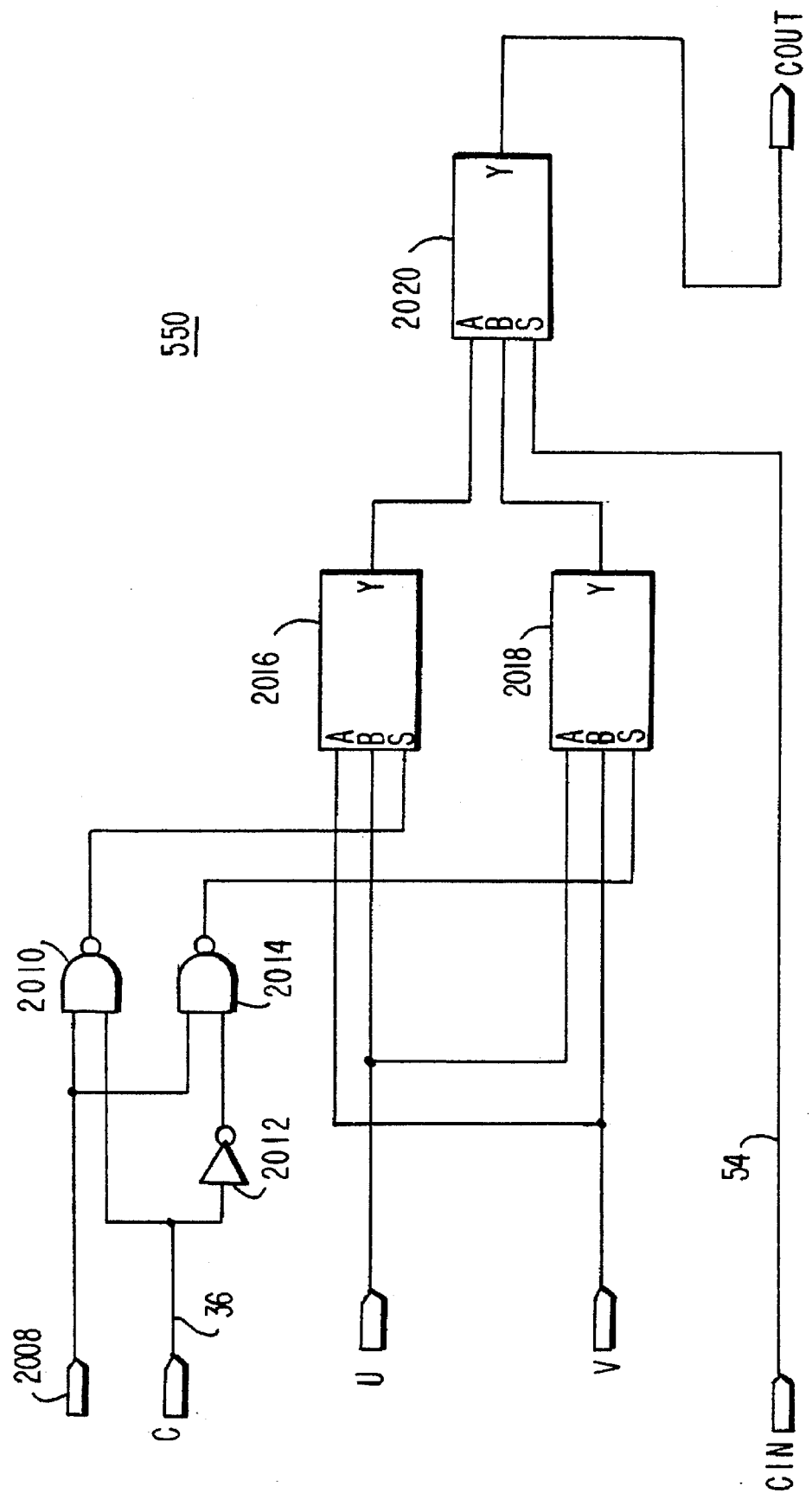

PROGRAMMABLE LOGIC ARRAY INTEGRATED CIRCUIT DEVICES WITH FLEXIBLE CARRY CHAINS

BACKGROUND OF THE INVENTION

This invention relates to programmable logic array integrated circuit devices, and more particularly to improved carry chain circuitry for use in such devices.

Cliff et al. U.S. Pat. No. 5,274,581 (which is hereby incorporated reference herein) shows circuitry which is suitable for use as a basic logic module in a programmable logic array integrated circuit device. Among the many possible logic functions this circuitry can perform, some special features are included to facilitate use of the circuitry to perform one place of binary addition. This includes accepting two addend bits and a carry in bit (from the logic module performing the next lower order place of the addition) and producing a sum out bit and a carry out bit (for application as a carry in bit to the logic module performing the next higher order place of the addition). (Although for the most part only adders and addition are discussed in detail herein, it will be appreciated that adders are at the heart of other possible uses of this logic module circuitry. Among these other possible uses are subtraction and many different kinds of counters (e.g., up counters, down counters, loadable counters, resettable counters, etc.). This is discussed in more detail in the '581 patent. References to adders, addition, or the like herein will be understood to also include these various other possible uses of the apparatus.)

The '581 patent shows the carry out terminal of each logic module being "hard wired" to the carry in terminal of another (usually adjacent) logic module so that the logic modules are arranged in a fixed order in a carry chain. Thus if one wishes to use the carry chain circuitry, the fixed order of the logic modules along the carry chain dictates the arithmetic place that each logic module must perform. This restriction can reduce the overall usability of the programmable logic array device. For example, as a result of other logic which must be placed on the device, it may be found that only certain groups of logic modules have the connectivity required to receive the addend bits in the required order and to produce the sum out bits also in the required order. Or it may be found that in order to place an adder in the particular group of logic modules that has the proper connectivity for the addend and sum out bits, it is not possible to place on the device other logic that is needed.

In view of the foregoing, it is an object of this invention to provide improved programmable logic array integrated circuit devices.

It is a more particular object of this invention to provide improved carry chain circuitry for programmable logic array integrated circuit devices.

SUMMARY OF THE INVENTION

These and other objects of the invention are accomplished in accordance with the principles of the invention by providing alternate routing for the carry out bit of each logic module. In addition to the connection that the Cliff et al. patent shows from the carry out output of each logic module to the carry in terminal of another particular (usually adjacent) logic module, the carry out output of each logic module is also programmably connectable to the more general interconnection resources of the device. For example, the carry out output of each logic module may be programmably connectable to circuitry provided on the device for programmably connecting logic module outputs to the inputs of any of an associated group of logic modules. Alternatively or in addition the carry out output of each logic module may be programmably connectable to circuitry provided on the device for programmably connecting logic module outputs to the inputs of any logic modules on the device. These additional possible routings for carry signals allow use of the features of the logic modules that facilitate performing binary addition without being restricted to a particular order of the logic modules in the adder. All or part of the carry chain can be routed through the more general interconnection circuitry of the device if it is desired for any reason to permute the logic modules in an adder. This eases restrictions on use of the logic modules, thereby increasing the overall usability of the device.

Another feature of the invention relates to improved circuitry for utilizing the carry in signal in each logic module. This improved circuitry reduces delay in the carry chain when the carry out to carry in connections between adjacent logic modules are used.

Further features of the invention, its nature and various advantages will be more apparent from the accompanying drawings and the following detailed description of the preferred embodiments.

BRIEF DESCRIPTION OF THE DRAWINGS

FIG. 2 is a more detailed schematic block diagram of a preferred embodiment of a portion of the logic shown in FIG. 1.

DETAILED DESCRIPTION OF THE PREFERRED EMBODIMENTS

Figure 1:
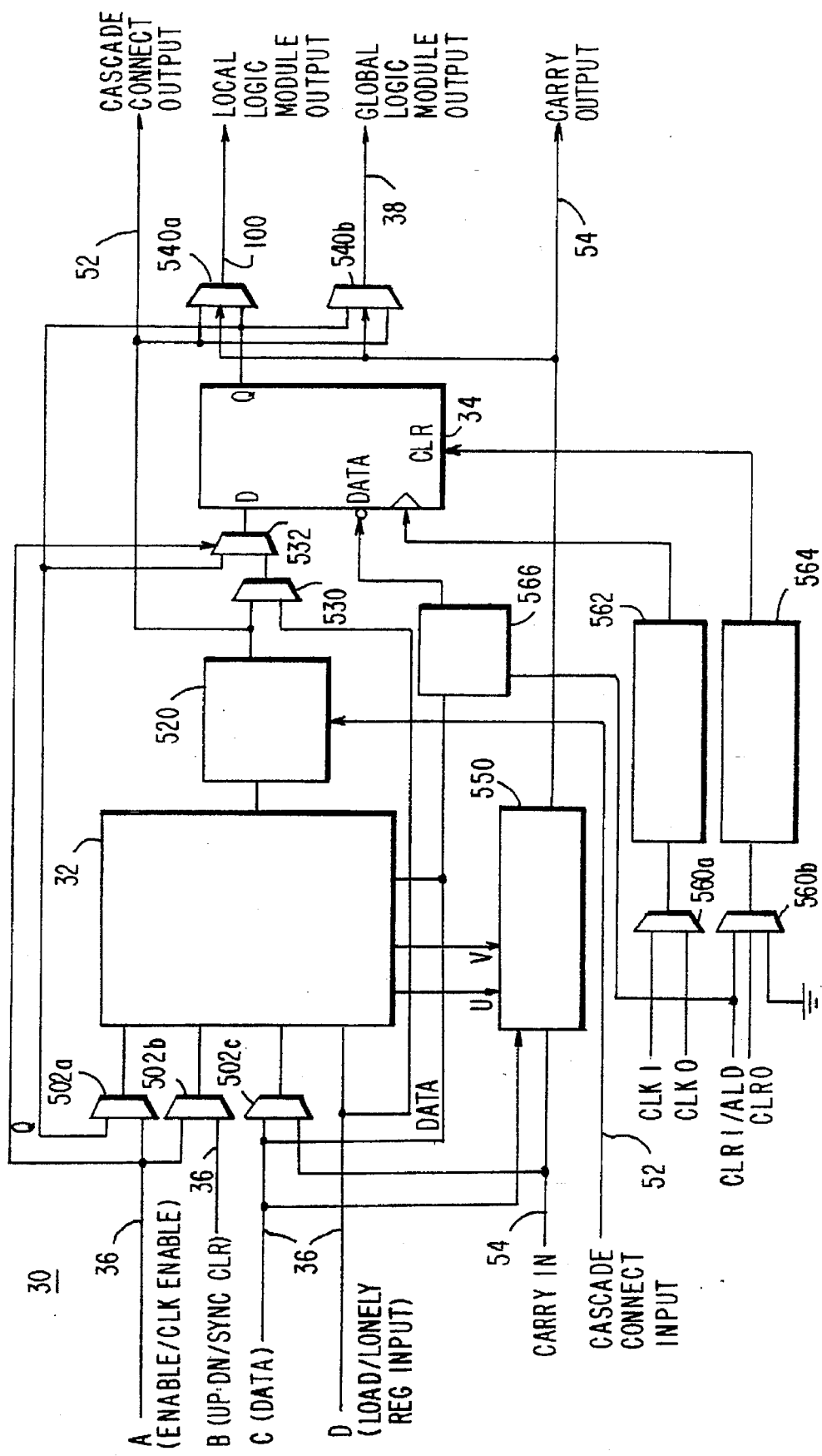
FIG. 1 is a schematic block diagram of an illustrative embodiment of a representative portion of a programmable logic array integrated circuit device constructed in accordance with this invention.

FIG. 1 shows an illustrative programmable logic array integrated circuit logic module 30 constructed in accordance with this invention. In many respects this logic module is similar to the logic module shown in FIG. 8 of commonly assigned, co-pending Cliff et al. application Ser. No. 08/442,795, filed May 17, 1995, which is hereby incorporated by reference herein. To facilitate comparison with the '795 application the same reference numbers are used in FIG. 1 hereof as are used for at least generally similar elements in FIG. 8 of the '795 application. Some of the features of the FIG. 1 logic module are also present in the logic module shown in FIG. 3 of above-mentioned Cliff et al. U.S. Pat. No. 5,274,581. In other words, the '795 application shows further development of the '581 patent logic module, and the present invention relates to further improvements on the '795 application logic module. Because many aspects of the FIG. 1 logic module have already been explained in detail in the '581 patent and the '795 application, a somewhat abbreviated description of the logic module can be provided herein.

It should also be noted that the '795 application shows an example of a programmable logic array integrated circuit device in which the logic module of this invention can be used. In other words, the logic module shown herein can be used to replace the logic module shown in the '795 application in programmable logic array devices such as are shown in the '795 application, and the resulting devices will have the additional advantages described herein.

To briefly review the various components of logic module 30, each of elements 502a, 502b, 502c, 530, 532, 540a, 540b, 560a, and 560b is a programmable logic connector or "PLC," as that term is defined, for example, in the '795 application. Although the above-mentioned definition makes it clear that PLCs can have other constructions and functions, each PLC may be thought of in the first instance as a programmable switch for connecting any one of its inputs to its output.

Element 32 is a programmable universal logic block or "ULB," as that term is defined in the '795 application. For example, ULB 32 may be a programmable four-input look up table which is capable of producing on its main output (connected to element 520) a signal indicative of any logical combination of its four main inputs (along the left side of ULB 32). As shown and described in the '581 patent, ULB 32 is effectively partitionable into two parts when the ULB is to perform one place of binary addition. The ULB output signals labelled U and V (corresponding to signals X and Y in the '581 patent) are then precursors of a carry out signal, while the main ULB output signal (applied to cascade connect circuit 520) is the sum out signal.

Element 550 is carry select logic circuitry which uses a carry in signal from either carry in lead 54 or one of the main feeds to ULB 32 to effectively select the correct carry out signal from the U or V signals. In the particular embodiment shown in FIG. 1 the alternative carry in signal source is the C input to ULB 32. This is similar to what is shown in the vicinity of switch 128 in the '581 patent. A possible variation uses the D input to ULB 32 as the alternative carry in signal source.

The carry out signal produced by carry select logic circuitry 550 is applied to carry out lead 54 and also to each of PLCs 540a and 540b. As compared to what is shown in the '795 application, these connections to PLCs 540 are new in accordance with this invention. As in the '581 patent and the '795 application, the carry out lead 54 of each logic module is connected to the carry in lead 54 of another (usually adjacent) logic module.

Carry select logic circuitry 550 may be constructed as shown, for example, by elements 128, 156, 158, and 160 in the '581 patent. However, a presently more preferred construction of component 550 is shown in FIG. 2 and described in detail below after FIG. 1 has been completely described.

Element 520 is cascade connect logic circuitry of the type described, for example, in Cliff et al. U.S. Pat. No. 5,258,668. This circuitry (together with the associated connections 52 to adjacent logic modules) is not relevant to this invention and can be assumed for present purposes to simply pass the main ULB output through unaltered. PLCs 530 and 532 are also not particularly relevant to this invention and can be assumed for present purposes to pass the output of element 520 through to the D input terminal of flip-flop or register device 34.

Flip-flop 34 receives a clock signal from clock control circuitry 562. PLC 560a selects one of two available clock signals for possible use by clock control circuitry 562. Flip-flop 34 can be cleared by a signal from clear control circuitry 564. PLC 560b selects one of several applied signals for possible use by clear control circuitry 564. Flip-flop 34 can also be loaded with data from the C input to ULB 32 via asynchronous load control circuitry 566. Circuit 566 is controlled by an asynchronous load signal (which is also one of the inputs to PLC 560b). (In the '795 application asynchronous load control circuitry 566 is not shown separately, but rather is shown as part of clock control circuitry 562.) In the context of the present invention flip-flop 34 is used when the logic module is to operate as a counter or is to otherwise register the results of an addition or subtraction. The clear function may be used to clear or reset the counter or register. The data loading feature may be used to pre-load the counter or register.

The Q output of flip-flop 34 is applied to PLC 502a (to facilitate use of the apparatus as a counter) and to each of PLCs 540a and 540b. A second input to each of PLCs 540a and 540b is the unregistered output of cascade connect circuitry 520. In this way flip-flop 34 may be bypassed when the logic module is not being used as part of a counter and registration of the output signal of ULB 32 is not required. The third input to each of PLCs 540a and 540b is the carry out output signal from carry select logic circuitry 550. As mentioned above, these third connections to PLCs 540 are new (as compared to what is shown in the '795 application) in accordance with the present invention.

The output signal of PLC 540a is applied to "local" logic interconnection circuitry 100. As shown, for example, by the similarly numbered circuitry in the '795 application, circuitry 100 allows the output of each logic module in a local group of logic modules to be programmably connected to the inputs 36 of any of the logic modules in that group. (In the '795 application the reference number 20 is applied to such local groups of logic modules.) The output signal of PLC 540b is applied to "global" interconnection circuitry 38. As shown, for example, in the '795 application, circuitry 38 (assumed herein to also include such other '795 application circuitry as 60, 70, 80, and 90) allows the output of each logic module on the programmable logic array device to be programmably connected to the inputs 36 of any logic modules on the device. PLC 540a thus allows the carry out bit of any logic module to be routed to any logic module in the local group of modules that includes the logic module producing the carry out signal. Alternatively, PLC 540b allows the carry out bit of any logic module to be routed to any other logic module on the device. The device is no longer restricted to using only the dedicated carry out to carry in connections 54 between adjacent logic modules. When PLC 540a or 540b is used to route a carry out signal to another logic module, that signal enters the other logic module via the C input of that module. The carry select logic circuit 550 in the receiving module uses the C input rather than the dedicated carry in input 54 to form its carry out signal from the applied U and V signals.

It should be noted that if one of PLCs 540a and 540b is used for the carry out signal of a logic module, then the other of those PLCs must be used for the sum out bit of that logic module.

A particularly preferred embodiment of carry select logic 550 is shown in FIG. 2. A programmable function control element or "FCE" (as that term is defined in the '795 application) 2008 is provided on the device for each carry select logic circuit 550. FCE 2008 is programmed to produce an output signal which is logic 0 if the associated circuit 550 is to use its carry in input 54. FCE 2008 is programmed to produce an output signal which is logic 1 if the associated circuit 550 is to use its C input as a carry in input. Programing FCE 2008 to produce logic 0 forces the outputs of NAND gates 2010 and 2014 to logic 1 regardless of whether the C input is logic 0 or logic 1. A logic 1 signal applied to the select ("S") input terminal of each of PLCs 2016 and 2018 causes those devices to select their "B" inputs for application to their "Y" outputs. This causes the U signal to be applied to the "A" input of PLC 2020, while the V signal is applied to the "B" input of that PLC. The dedicated carry in signal on lead 54, which is applied to the select ("S") input terminal of PLC 2020 then causes that device to select U or V as the carry out signal applied to its "Y" output terminal. In particular, U is selected as the carry out signal if the dedicated carry in signal is logic 0, and V is selected as the carry out signal if the dedicated carry in signal is logic 1.

Programming FCE 2008 to produce logic 1 allows the C input to select which of NAND gates 2010 and 2014 will produce logic 0 and which will produce logic 1. If the C input is logic 1, then NAND gate 2010 produces logic 0 and NAND gate 2014 produces logic 1 (due to the inversion of C by inverter 2012). On the other hand, if the C input is logic 0, then NAND gate 2010 produces logic 1 and NAND gate 2014 produces logic 0. If NAND gate 2010 produces logic 0 (and NAND gate 2014 accordingly produces logic 1), then PLC 2016 selects V as its output and PLC 2018 also selects V as its output. On the other hand, if NAND gate 2010 produces logic 1 (and NAND gate 2014 accordingly produces logic 0), then both of PLCs 2016 and 2018 select U as their outputs. From the last two sentences it will be seen that the C input effectively selects U or V as the output of both of PLCs 2016 and 2018. It then does not matter what the carry in input signal on lead 54 is because the "A" and "B" inputs to PLC 2020 are both the same. The U or V signal selected by both of PLCs 2016 and 2018 passes through PLC 2020 regardless of whether the "A" or "B" input of that PLC is selected by the dedicated carry in signal on lead 54.

As compared to the circuitry shown in the '581 patent in which the dedicated carry in signal must pass through a switch circuit 128 before it can act on switch 160 to select the carry out signal, in the embodiment shown in FIG. 2 herein the dedicated carry in signal is applied directly to PLC 2020. This speeds up the dedicated carry chain circuit of this invention as compared to the dedicated carry in circuit of the '581 patent.

It will be understood that the foregoing is only illustrative of the principles of this invention and that various modifications can be made by those skilled in the art without departing from the scope and spirit of the invention. For example, the particular logic components shown in FIG. 2 are merely examples, and logically equivalent circuitry can be substituted if desired.

The Invention Claimed Is:

1. A programmable logic array integrated circuit comprising:
   a plurality of logic modules, each of which is programmable to produce a sum out signal and a carry out signal indicative of the sum and carry out from addition of two addend signals and a carry in signal applied to that logic module;
   a programmable network of interconnection conductors for programmably selectively connecting outputs of said logic modules to inputs of said logic modules;
   a carry chain conductor extending between each pair of said logic modules for conducting a carry out signal from one of said logic modules in said pair to the other logic module in said pair for possible use as a carry in signal by said other logic module in said pair;
   first programmable logic circuitry associated with each of said logic modules for selectively substituting a signal on one of said inputs to said logic module which is connected to said programmable network of interconnection conductors for the carry in signal received by that logic module via a carry chain conductor; and
   second programmable logic circuitry associated with each of said logic modules for selectively applying the carry out signal of said logic module to one of said outputs of said logic module which is connected to said programmable network of interconnection conductors.

2. The apparatus defined in claim 1 wherein said programmable network of interconnection conductors comprises:
   a plurality of subnetworks of local interconnection conductors, each of said subnetworks being associated with a respective subplurality of said logic modules for programmably selectively connecting outputs of said logic modules in said subplurality to inputs of said logic modules in said subplurality; and
   a network of global interconnection conductors for programmably selectively connecting outputs of any of said logic modules to inputs of substantially any of said logic modules.

3. A programmable logic array integrated circuit comprising:
   a plurality Of logic modules, each of which is programmable to produce sum out signal carry out signal; indicative of the and array out from addition of two addend signals and carry in signal applied to that logic module;
   programmable network of interconnection conductors for programmably selectively connecting outputs of said logic modules to inputs of said logic modules, said programmable network comprising:
   a plurality of subnetworks of local interconnection conductors, each of said subnetworks being associated with a respective subplurality of said logic modules for programmably selectively connecting outputs of said logic modules in said subplurality to inputs of said logic modules in said subplurality, and
   a network of global interconnection conductors for programmably selectively connecting outputs of any of said logic modules inputs of substantially any of said logic modules;
   a carry chain conductor extending between each pair of said logic modules for conducting a carry out signal from one of said logic modules in said pair to the other logic module in said pair for possible use is carry an signal by said other logic module in said pair;
   first programmable logic circuitry associated with each of said logic modules for selectively substituting a signal on one of said inputs to said logic module which is connected to said programmable network of interconnection conductors for the carry in signal received by that logic module via a carry chain conductor; and
   second programmable logic circuitry associated with each of said logic modules for selectively applying the carry out signal of said logic module to one of said outputs of said logic module which is connected to said programmable network of interconnection conductors, said second programmable logic circuitry comprising:
   a first subcircuit for selectively applying to a first output of said logic module either the sum out or the carry out signal of said logic module, said first output being connected to the subnetwork of local interconnection conductors which is associated with the subplurality of logic modules that includes said logic module, and
   a second subcircuit for selectively applying to a second output of said logic module either the sum out or the carry out signal of said logic module, said second output being connected to the network of global conductors.

4. The apparatus defined in claim 1 wherein each of said logic modules comprises:

a register circuit for selectively registering the sum out signal of said logic module.

5. A programmable logic array integrated circuit comprising:

a plurality of logic modules, each of which is programmable to produce a sum out signal and a carry out signal indicative of the sum and carry out from addition of two addend signals and a carry in signal applied to that logic module;

a programmable network of interconnection conductors for programmably selectively connecting outputs of said logic modules to inputs of said logic modules;

a carry chain conductor extending between each pair of said logic modules for conducting a carry out signal from one of said logic modules in said pair to the other logic module in said pair for possible use as a carry in signal by said other logic module in said pair;

first programmable logic circuitry associated with each of said logic modules for selectively substituting a signal on one of said inputs to said logic module which is connected to said programmable network of interconnection conductors for the carry in signal received by that logic module via a carry chain conductor, said first programmable logic circuitry comprising:

a programmable element for producing an output signal indicative of whether a signal on one of said inputs to said logic module or the carry in signal received by that logic module via a carry chain conductor is to be used by that logic module as its carry in signal, carry out signal precursor processing circuitry responsive to the output signal of said programmable element for passing through two carry out signal precursor signals if said output signal of said programmable element indicates that said carry in signal received via a carry chain conductor is to be used, said carry out signal precursor processing circuitry being further responsive to the signal on said one of said inputs to said logic module by substituting one of said carry out signal precursor signals, as selected by the signal on said one of said inputs to said logic module, for the other of said carry out signal precursor signals in the two signals passed through by said carry out signal precursor processing circuitry, and carry out signal precursor selection circuitry responsive to said carry in signal received by said logic module via a carry chain conductor for selecting said carry out signal of said logic module from the two signals passed through by said carry out signal precursor processing circuitry; and second programmable logic circuitry associated with each of said logic modules for selectively applying the carry out signal of said logic module to one of said outputs of said logic module which is connected to said programmable network of interconnection conductors.

* * * * *